United States Patent
Ten Pierick et al.

(10) Patent No.: US 6,489,735 B2
(45) Date of Patent: Dec. 3, 2002

(54) GENERATING A NON-LINEAR WAVEFORM

(75) Inventors: Hendrik Ten Pierick, Eindhoven (NL); Christinus Johannes Van Valburg, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/840,814

(22) Filed: Apr. 24, 2001

(65) Prior Publication Data

US 2002/0074957 A1 Jun. 20, 2002

(30) Foreign Application Priority Data

Apr. 26, 2000 (EP) .............................. 00201497

(51) Int. Cl.[7] .................................. G09G 1/04
(52) U.S. Cl. ................... 315/371; 315/370; 315/368.18; 315/368.21
(58) Field of Search ................ 315/371, 370, 315/368.18, 368.19, 368.21, 368.22, 368.23

(56) References Cited

U.S. PATENT DOCUMENTS

| | | | |
|---|---|---|---|
| 4,891,565 A | | 1/1990 | Ten Pierick et al. ........ 315/408 |
| 5,051,608 A | * | 9/1991 | Ten Pierick et al. ........ 307/261 |
| 5,444,500 A | * | 8/1995 | Ten Pierick et al. ........ 348/807 |
| 5,581,163 A | | 12/1996 | De Lima et al. ............ 315/371 |
| 5,583,400 A | * | 12/1996 | Hulshof et al. ............. 315/371 |
| 6,023,133 A | * | 2/2000 | Leung et al. .......... 315/368.21 |
| 6,137,244 A | * | 10/2000 | Chaussy ..................... 315/371 |

* cited by examiner

Primary Examiner—Don Wong
Assistant Examiner—Tuyet Vo
(74) Attorney, Agent, or Firm—Steven R. Biren

(57) ABSTRACT

In a waveform generator, a repetitive non-linear waveform is generated by varying the number supplied to a pulse reduction circuit during the repetition period. Consequently, the pulse reduction circuit supplies a number of desired output pulses, which number varies in time corresponding to the varying number. For example, when a lower number is inputted to the pulse reduction circuit during a sub-period of the repetition period, a corresponding lower number of output pulses will be generated. Consequently, a lower number of increment values will be summed or integrated during this sub-period and the waveform changes less steeply.

13 Claims, 3 Drawing Sheets

GENERATING A NON-LINEAR WAVEFORM

BACKGROUND OF THE INVENTION

This invention relates to a waveform generator, a field deflection circuit comprising a waveform generator, a display apparatus comprising a field deflection circuit, and a method of generating a periodic waveform.

U.S. Pat. No. 4,891,565 discloses a field deflection circuit including a sawtooth generator for generating an essentially sawtooth-shaped voltage. The circuit is provided with a storage element in which information is stored under the influence of applied clock pulses. Per field period, the number of times when the content of the storage element is changed is reduced to a predetermined number, e.g. because a number of clock pulses is omitted. The clock pulses applied to the sawtooth generator are then distributed as regularly as possible. More in detail, a pulse reduction circuit (which may be a rate multiplier) converts a number of input pulses (the clock pulses) occurring during a vertical scan period into a fixed number of output pulses. Integrating a fixed value to an output voltage at each output pulse, generates a waveform. In this way, a linear waveform is generated with a constant amplitude (the fixed number of output pulses multiplied by the fixed value) independent of the duration of the field scan period.

It is a drawback of this prior art that the waveform is limited to a linear sawtooth only.

SUMMARY OF THE INVENTION

It is an object of the invention to provide a simple waveform generator with a pulse reduction circuit, which waveform generator is able to provide an arbitrary waveform.

To this end, a first aspect of the invention provides a waveform generator as claimed in claim 1. A second aspect of the invention provides a field deflection circuit comprising a waveform generator as claimed in claim 5. A third aspect of the invention provides a display apparatus comprising a field deflection circuit as claimed in claim 7. A fourth aspect of the invention provides a method of generating a periodical waveform as claimed in claim 8. Advantageous embodiments are defined in the dependent claims.

The waveform generator according to the first aspect of the invention generates a non-linear waveform by introducing a correction circuit which varies the number, fixed in the prior art, supplied to the pulse reduction circuit. Consequently, the pulse reduction circuit supplies a number of desired output pulses which varies in time corresponding to the varying number. For example, when a lower number is inputted to the pulse reduction circuit during a sub-period of the repetition period (the repetition period may be the field scan-period), a corresponding lower number of output pulses will be generated. Consequently, a lower number of increment values will be summed or integrated during this sub-period and the waveform rises less steeply.

For example, a non-linear waveform is required in a field deflection circuit of a cathode ray tube. A linear field scan requires an S-corrected sawtooth-shaped field deflection current. Another example of a non-linear waveform is a field frequency parabola as may be used for an East-West correction or dynamic focussing.

The invention can be used to generate a field frequency waveform as in the prior art, but may also generate a line frequency waveform, or a waveform having any desired periodicity.

In the prior art, the pulse reduction circuit generates a linear sawtooth waveform. If another waveform is required, a complex analog multiplier is used to multiply the sawtooth by a correction waveform.

In an embodiment of the invention, the correction circuit comprises a calculator which receives a synchronizing signal indicating the repetition period. During the repetition period, the calculator supplies a series of predetermined numbers to the pulse reduction circuit. Values of the successive numbers correspond to differentiated values of the desired non-linear periodic waveform.

In an embodiment of the invention as claimed in claim 4, two small pulse reduction circuits instead of one large pulse reduction circuit are implemented. The first pulse reduction circuit generates a fixed number q (for example, 256) of pulses during the repetition period. In this way, the repetition period is divided into a fixed number of q sub-periods or sections. In each of the sections, the correction circuit supplies a predetermined number to the second pulse reduction circuit which will output this predetermined number of pulses during this section. The non-linear waveform is obtained when the correction circuit calculates different predetermined numbers for different sections. In this way, the repetition period is divided into a fixed number of sections independent of the duration of the repetition period. The correction circuit is simply synchronized with the output signal of the first pulse reduction circuit to supply a predetermined number (of desired output pulses to be supplied by the second pulse reduction circuit) for each section. It is not required to separately synchronize the correction circuit with the repetition period to allow generation of the correct predetermined numbers during the correct sections to obtain the correctly shaped non-linear waveform.

These and other aspects of the invention are apparent from and will be elucidated with reference to the embodiments described hereinafter.

DESCRIPTION OF THE PREFERRED EMBODIMENT

In the different Figures, the same references refer to the same functions operating in the same way.

Figure 1:
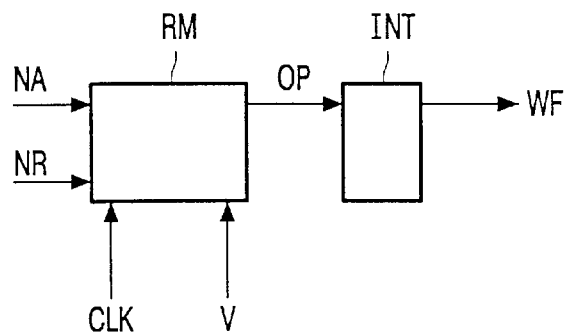
FIG. 1 shows a prior-art sawtooth generator with a rate multiplier.

FIG. 1 shows a prior-art sawtooth generator with a rate multiplier RM. The rate multiplier RM receives the value NA which is equal to the number of input pulses received during the repetition period, the value NR which is equal to the desired number of output pulses OP during the repetition period, a clock signal CLK, and a synchronization signal V indicating (for example, a start instant) of the repetition period. The rate multiplier RM supplies the desired fixed number of output pulses OP to an integrator INT. The integrator INT sums a fixed value for every output pulse OP received to supply the sawtooth-shaped waveform WF. The integrator INT may be a switched capacitor or a digital integrator. An expensive highly linear multi-bit A/D converter is not required.

The rate multiplier RM comprises a register which sums to its content the required number NR of output pulses OP at every clock pulse CLK. If the register content exceeds the value NA, an output pulse OP is generated and the value NA is subtracted from the register content. This is further elucidated with respect to FIGS. 2 and 3. The rate multiplier algorithm can also be written in pseudo-vhdl:

```
count : count + nr          //increment at the clock pulse
if count >= na              //check for overflow
then
    output <= '1'           //thus an output pulse
    count := count – na     //na is subtracted from count
else
    output <= '0'           //no overflow and thus no output
endif
```

Figure 2:
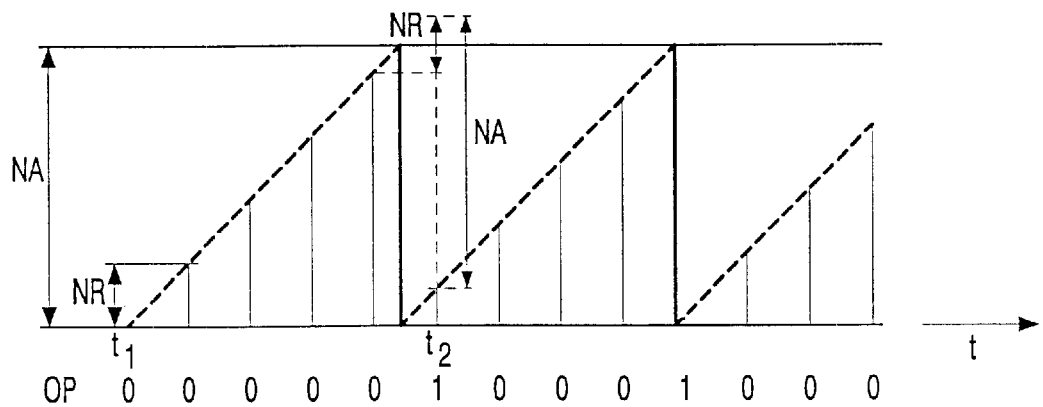
FIG. 2 elucidates the operation of the prior-art sawtooth generator of FIG. 1.

FIG. 2 elucidates the operation of the prior-art sawtooth generator of FIG. 1. In FIG. 2, the vertical lines show the register values at the clock instants. For ease of explanation, by way of example, the register value at the first clock pulse occurring at instant t1 has a zero value. At the instant t2, the value of the register exceeds the value NA, and an output pulse OP is generated as indicated by the 1 in the series of zeros and ones at the bottom of FIG. 2. Furthermore, the value NA is subtracted from the register content.

Figure 3:
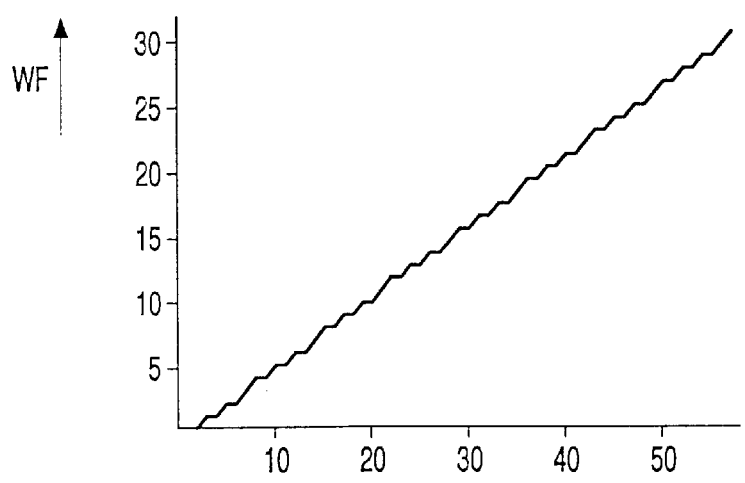
FIG. 3 shows an example of a sawtooth waveform generated by the prior-art. sawtooth generator.

FIG. 3 shows an example of a sawtooth waveform WF generated by the prior-art sawtooth generator. The horizontal axis indicates the number of clock pulses, the vertical axis shows the value of the waveform WF supplied by the integrator. In this example, the rate multiplier RM generates 32 out of 56 clock pulses. The points are interconnected to better show the resulting waveform WF. It should be noted that this waveform does not correspond one to one to the example shown in FIG. 2 wherein the number of output pulses OP is about one fifth of the number of input pulses NA. The deviation from the intended sawtooth is clearly visible in FIG. 3. However, by selecting a higher number of input and output pulses, the intended sawtooth waveform will be better approximated. As an example, a field frequency sawtooth waveform for driving a field deflection of a cathode ray tube will be generated sufficiently accurately when the number of output pulses OP is selected to be NR=1024, while the number of input pulses is NA=1888.

Figure 4:
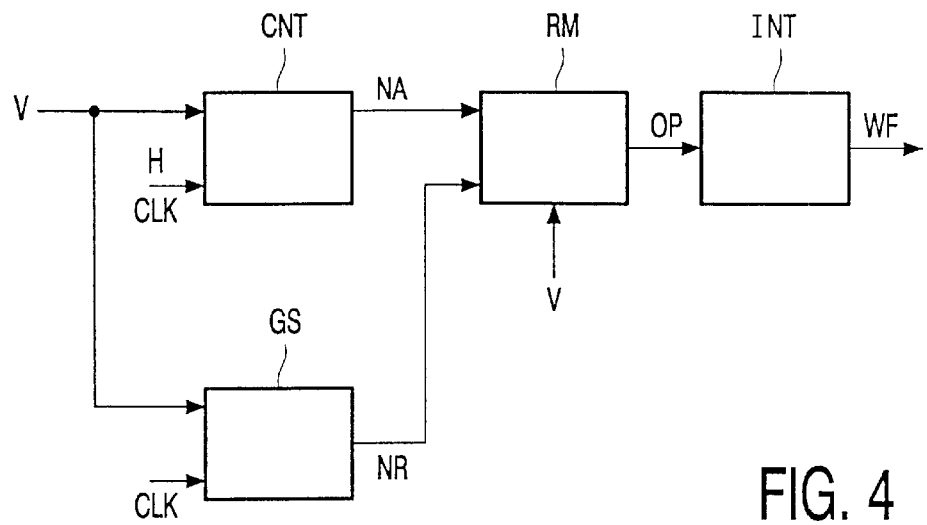
FIG. 4 shows a block diagram of a waveform generator in accordance with an embodiment of the invention.

FIG. 4 shows a block diagram of a waveform generator in accordance with an embodiment of the invention. Although, for ease of explanation, this embodiment of the invention is directed to a waveform generator for generating a field frequency waveform, the invention is not limited to a waveform generator generating a specific non-linear waveform. A counter CNT counts the number of clock pulses CLK occurring between two successive field (also referred to as vertical) synchronization pulses V. It would also be possible to count the number of horizontal synchronization pulses H between the two successive vertical synchronization pulses V. In practice, it may be more appropriate to only count the clock pulses CLK or the horizontal synchronization pulses H in the scan part of the field period as the waveform WF is required in this scan part. The rate multiplier RM converts this field deflection frequency-dependent number of counted pulses NA into a fixed desired amount NR of output pulses OP. The number NR of desired output pulses OP is calculated by the correction circuit GS. The correction circuit GS varies the desired number NR of output pulses OP during the field period. This results in a varying density of the output pulses OP during the field period. When this varying density of the output pulses OP is integrated, a non-linear waveform WF is generated. The correction circuit GS may comprise a calculating unit such as a micro processor for calculating the series of desired numbers NR required to obtain the desired non-linear waveform WF. It is also possible to store the series of desired numbers NR in a memory, so that, the correction circuit GS only needs to retrieve the stored values. If the correction circuit GS comprises clocked circuits, the clock signal CLK has to be available. The variation of the series of desired numbers NR has to fit the differentiated desired non-linear waveform WF.

The correction circuit GS needs to supply the series of desired numbers NR at the correct instants with respect to the field period to obtain the correct non-linear waveform WF. To this end, the correction circuit GS receives the vertical synchronizing signal V.

Figure 5:
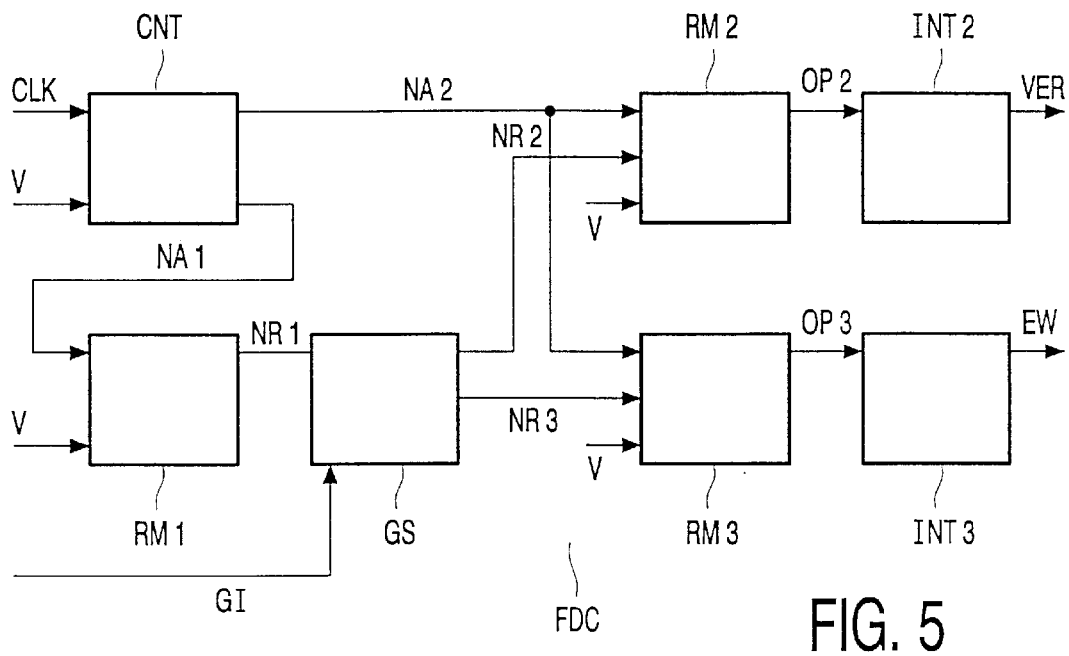
FIG. 5 shows a block diagram of a waveform generator in accordance with an embodiment of the invention.

FIG. 5 shows a block diagram of a waveform generator in accordance with an embodiment of the invention. Again, by way of example, as shown in the block diagram, the following explanation of its operation is elucidated with respect to generation of field frequency waveforms in television receivers. A counter CNT receives a vertical synchronization signal V, and a clock signal CLK to supply a first count value NA1 and a second count value NA2. A first pulse reduction circuit RM1 receives the first count value NA1 and the vertical synchronization signal V, to supply a first fixed desired number NR1 to the correction circuit GS. The correction circuit GS further receives geometry input-data GI, and supplies a series of second numbers NR2 and a series of third numbers NR3. A second pulse reduction circuit RM2 receives the second count value NA2, the series of second numbers NR2, and the vertical synchronization signal V, to supply first output pulses OP2 to a first integrator INT2. The first integrator INT2 supplies an S-corrected vertical sawtooth waveform VER. A third pulse reduction circuit RM3 receives the second count value NA2, the series of third numbers NR3, and the vertical synchronization signal V, to supply second output pulses OP3 to a second integrator INT3. The second integrator INT3 supplies a vertical parabola waveform EW used for the well-known East-West correction.

The operation of the waveform generator of FIG. 5 will hereinafter be elucidated, by way of example, for a special application. The counter CNT measures the number of clock pulses in the vertical scan period. With a counter width of P bits, the maximum number of clock pulses $\leq 2^P$. The measured number of clock pulses is given in cnt(p−1:0) and used as NA1 in the first pulse reduction circuit RM1. When the number of segments is chosen to be a power of two or $2^S$ and with S=8, this gives 256 segments. The first fixed desired number NR1 to be supplied by the first pulse reduction circuit RM1 is then selected to be 256. Consequently, the first pulse reduction circuit RM1 generates 256 equally distributed pulses in the vertical scan period. In this way, 256 equally spaced segments are formed in the vertical scan period. The available number of clock pulses within a segment is defined by the most significant bits of the counter CNT, thus NA2 is cnt(p−1:s). The afore-mentioned choices ensure a very acceptable error frequency spectrum.

The correction circuit GS outputs 256 values for the second numbers NR2 and third numbers NR3, one value for each segment. The output pulse density of both the output pulses OP2 and OP3 of the second pulse reduction circuit RM2 and the third pulse reduction circuit RM3, respectively, is constant within a segment but changes 256 times in accordance with the 256 values of the second numbers NR2 and third numbers NR3. The 256 values for the second numbers NR2 and third numbers NR3 are defined by the geometry input data GI. The geometry input data GI may comprise the two times 256 values stored in a memory. The correction circuit GS retrieves the stored values from the memory, one stored value for each segment for each waveform to be generated. It is also possible to store a few coefficients of a polynomial. Now, the correction circuit calculates the values NR2 or NR3 to be supplied to the pulse reduction circuit RM2 or MR3 from the coefficients with an algorithm knowing the polynomial.

The integrated waveforms VER and EW consist of 256 linear segments. With this number of segments, a change in luminance or ringing due to a slope variation of successive segments is invisible.

The total number of output pulses OP2 and OP3 may easily exceed 64000 pulses. The error amplitude and the error frequency spectrum will be completely invisible.

The vertical synchronizing pulse V not only initiates the measurement of the available number of pulses in the scan but also resets all pulse reduction circuits RM1, RM2, RM3. This reset makes the pulse reduction circuits RM1, RM2, RM3 phase noise frame-synchronous.

Figure 6A:
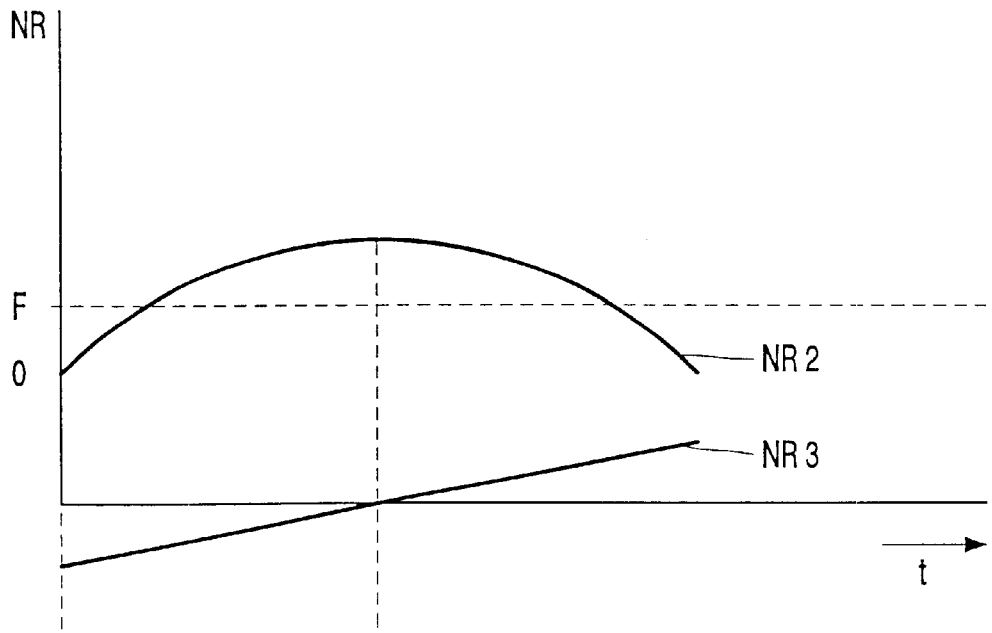
FIGS. 6A and 6B show waveforms for elucidating the block diagram of FIG. 5.
Figure 6B:
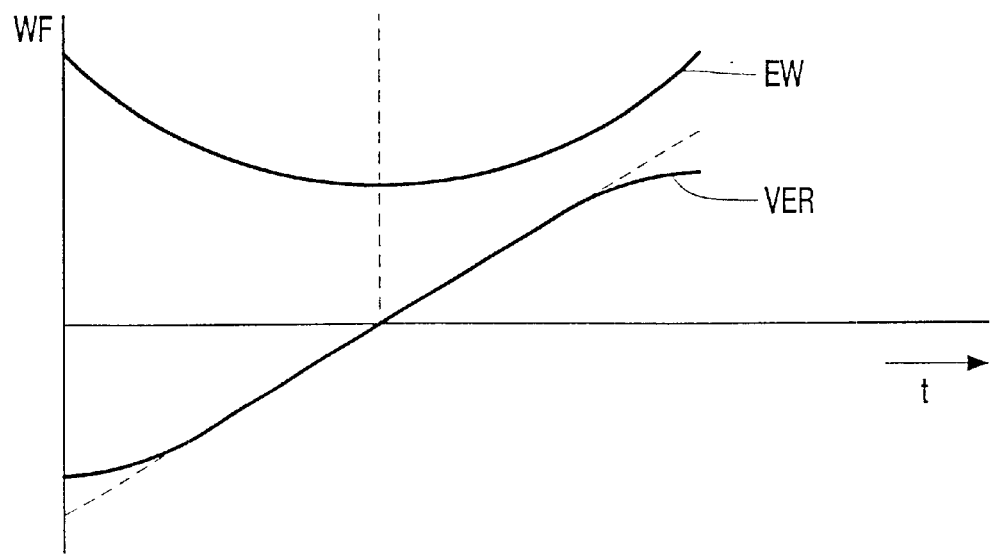

FIGS. 6A and 6B show waveforms for elucidating the block diagram of FIG. 5. FIG. 6A shows waveforms indicated by NR2 and NR3 interconnecting the 256 values NR2, NR3, respectively. FIG. 6B shows the resulting waveforms VER and EW supplied by the integrators INT2 and INT3, respectively. The dashed line shows a linear sawtooth which is obtained when the pulse reduction circuit receives fixed values F as depicted by the dashed horizontal line in FIG. 6A.

The S-corrected sawtooth waveform VER is obtained by varying the numbers NR2 parabola-wise around the fixed value F. The parabola waveform EW is obtained by varying the numbers NR3 linearly around zero.

In general, the input values of a pulse reduction circuit need to vary in a waveform shape which is equal to the differentiated desired waveform at the output.

Figure 7:
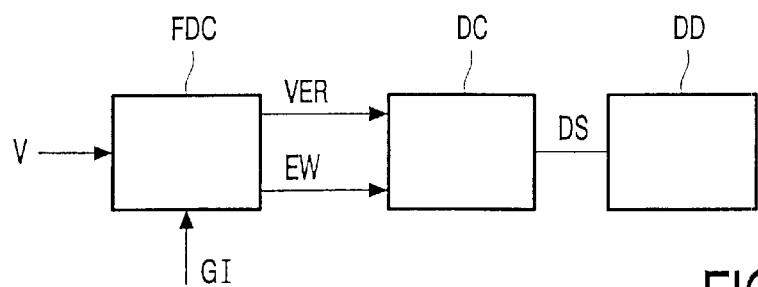
FIG. 7 shows a display apparatus with a waveform generator in accordance with an embodiment of the invention.

FIG. 7 shows a display apparatus with a waveform generator in accordance with an embodiment of the invention. The waveform generator FDC receives the vertical synchronizing signal V, and the geometry input data GI to supply the vertical deflection waveform VER and the east-west waveform EW to a deflection circuit DC. The deflection circuit DC supplies deflection signals to the display device DD. If the display device is a cathode ray tube, the deflection circuit generates the horizontal and vertical deflection currents in the deflection coils of the cathode ray tube DD.

In summary, a first aspect of the invention is to provide a waveform generator FDC for generating a repetitive non-linear waveform by varying the number supplied to the pulse reduction circuit during the repetition period. Consequently, the pulse reduction circuit supplies a number of desired output pulses, which number varies in time corresponding to the varying number. For example, when a lower number is inputted to the pulse reduction circuit during a segment of the repetition, a corresponding lower number of output pulses will be generated. Consequently, a lower number of increment values will be summed or integrated during this sub-period and the waveform changes less steeply.

It should be noted that the above-mentioned embodiments illustrate rather than limit the invention, and that those skilled in the art will be able to design many alternative embodiments without departing from the scope of the appended claims. Although the embodiments described in the Figures are directed to waveform generators FDC generating field frequency non-linear waveforms WF for use in a display apparatus with a picture tube, the invention is intended to also cover other waveform generators. The division of the bits of the counter CNT in FIG. 5, and the 256 segments are examples, and may be altered to fit the envisaged application. The waveform generator FDC in accordance with the invention may be used to generate a single waveform WF or a plurality of waveforms.

In the claims, any reference signs placed between parentheses shall not be construed as limiting the claim. The use of the verb "comprise" and its conjugations does not exclude the presence of elements or steps other than those stated in a claim. The invention can be implemented by means of hardware comprising several distinct elements, and by means of a suitably programmed computer. In the device claim enumerating several means, several of these means can be embodied by one and the same item of hardware.

What is claimed is:

1. A waveform generator for generating a periodic waveform (WF) having a repetition period, the waveform generator (FDC) comprising:

a pulse reduction circuit (RM) for receiving input pulses (NA) and a predetermined number (NR) to supply a reduced number of output pulses (OP) in the repetition period, independent of a duration of said repetition period, the reduced number of output pulses (OP) being equal to the predetermined number (NR), an integrator (INT) for integrating an increment value at said output pulses to obtain the periodic waveform, characterized in that the waveform generator further comprises a correction circuit (GS) for varying, during said repetition period, the predetermined number (NR) supplied to the pulse reduction circuit (RM) to obtain the periodic waveform (WF) having a non-linear shape.

2. A waveform generator as claimed in claim 1, characterized in that the pulse reduction circuit (RM) comprises a first and a second rate multiplier (RM1, RM2), the first rate multiplier (RM1) having an input for receiving the input pulses (NA1) to supply a lower fixed number q of segment pulses (NR1) during said repetition period, the correction circuit having an input for receiving said segment pulses (NR1) to supply a series of predetermined numbers (NR2, NR3) during said repetition period, one predetermined number (NR2, NR3) for each segment between two consecutive ones of the q segment pulses (NR1), the second rate multiplier (RM2) having an input for receiving said series of predetermined numbers (NR2, NR3), and an output for supplying the output pulses (OP2, OP3).

3. The waveform generator as claimed in claim 1 which further comprises a counter for receiving synchronizing instants (H) or clock instants (Clk) to repetitively count a predetermined number of the synchronizing instants or the clock instants during said repetition period, to obtain p groups of synchronizing instants or the clock instants during said repetition period, and one of said p predetermined numbers (NR) corresponds to each of said p groups.

4. A waveform generator as claimed in claim 1, characterized in that the correction circuit is adapted to receive a synchronizing signal (V) for supplying, during said repetition period, a series of p predetermined numbers (NR) of which successive values correspond to differentiated values of said periodic waveform.

5. A waveform generator as claimed in claim 4, characterized in that said correction circuit further comprises a counter (CNT) for receiving synchronizing instants (H) or clock instants (Clk) to repetitively count a predetermined number of the synchronizing instants or the clock instants during said repetition period, to obtain p groups of the synchronizing instants (H) or the clock instants (Clk) during said repetition period, and one of said p predetermined numbers (NR) corresponds to each of said p groups.

6. The waveform generator as claimed in claim 1 further comprising:
means for supplying to the correction circuit a synchronizing signal and clock pulses, and
a counter which receives said clock pulses and said synchronizing signal and in response supplies said input pulses (NA) to the pulse reduction circuit.

7. The waveform generator as claimed in claim 6 further comprising:
means for supplying to the pulse reduction circuit said synchronizing signal.

8. A field deflection circuit for displaying a field of lines, comprising a waveform generator for generating a periodic waveform (WF) having a field period, the waveform generator comprising:
a pulse reduction circuit (RM) for receiving the input pulses (NA) and a predetermined number (NR) to supply a reduced number of output pulses (OP) in the field period, independent of a duration of said field period, the reduced number of output pulses (OP) being equal to the predetermined number (NR),
an integrator (INT) for integrating an increment value at said output pulses (OP) to obtain said periodic waveform, characterized in that the waveform generator further comprises a correction circuit (GS) for varying, during said field period, the predetermined number (NR) supplied to the pulse reduction circuit (RM) to obtain the periodic waveform (WF) having a non-linear shape.

9. A field deflection circuit as claimed in claim 8, characterized in that said correction circuit (GS) further comprises a counter (CNT) for receiving line-synchronizing instants (H) to repetitively count a predetermined number of the lines during said field period to obtain p groups of lines during said field period, while one of said predetermined numbers (NR) corresponds to each of said p groups.

10. A display apparatus comprising:
a picture display device (DD),
a field deflection circuit (DC) for displaying a field of lines on the picture display device, and
a waveform generator for generating a periodic waveform (WF) having a repetition period, the waveform generator comprising:
a pulse reduction circuit (RM) for receiving input pulses (NA) and a predetermined number (NR) to supply a reduced number of output pulses (OP) in the repetition period, independent of a duration of said repetition period, the reduced number of output pulses (OP) being equal to the predetermined number (NR),
an integrator (INT) for integrating an increment value at said output pulses (OP) to obtain the periodic waveform, characterized in that the waveform generator further comprises a correction circuit (GS) for varying, during said repetition period, the predetermined number (NR) supplied to the pulse reduction circuit (RM) to obtain the periodic waveform having a non-linear shape.

11. The display apparatus as claimed in claim 10 further comprising:
means for supplying to the correction circuit a synchronizing signal, and
the correction circuit, in response, supplies, during said repetition period, a series of p predetermined numbers (NR) of which successive values correspond to differentiated values of said periodic waveform.

12. A method of generating a periodic waveform having a repetition period and comprising the steps of:
reducing (RM) a number of the input pulses (NA) to a predetermined number (NR) to supply a reduced predetermined number (NR) of output pulses (OP) in the repetition period, independent of a duration of said repetition period,
integrating an increment value at said output pulses to obtain the periodic waveform, and varying, during said repetition period, the predetermined number (NR) to obtain a periodic waveform having a non-linear shape.

13. The periodic waveform generating method as claimed in claim 8 further comprising:
in response to a synchronizing signal, supplying, during said repetition period, a series of p predetermined numbers (NR) of which successive values correspond to differentiated values of the periodic waveform.

* * * * *